United States Patent [19]

Tracy

[11] Patent Number: 4,916,409

[45] Date of Patent: Apr. 10, 1990

[54] SIGNAL CONDITIONER SYSTEM FOR MUSICAL INSTRUMENTS

[76] Inventor: Daniel L. Tracy, 1500 W. 92nd - Space 37, Thornton, Colo. 80221

[21] Appl. No.: 207,248

[22] Filed: Jun. 15, 1988

[51] Int. Cl.[4] ............................................. H03F 1/34
[52] U.S. Cl. ..................................... 330/294; 84/723; 330/51; 330/104; 330/278
[58] Field of Search ................. 330/51, 107, 109, 112, 330/100, 104, 294, 306, 278; 84/1.16; 381/98, 101, 102, 121, 123; 383/28 T

[56] References Cited

U.S. PATENT DOCUMENTS 3,209,083  9/1965  Posen .................................. 381/121
3,493,669  2/1970  Elbrecht et al. ................. 330/294 X Primary Examiner—James B. Mullins
Attorney, Agent, or Firm—John E. Reilly

[57] ABSTRACT

An audio signal conditioning system comprising a power supply for providing a direct current having a predetermined voltage; input gain control device for receiving the audio sound output signals and for controlling gain; a first transistor amplifier connected to the input gain control, the first transistor providing a first amplified output signal from the collector thereof; a second transistor amplifier connected to the first transistor amplifier for receiving amplified signals from the first transistor amplifier and providing a second amplified output signal from the collector thereof; a negative feedback circuit between the first transistor amplifier and the second transistor amplifier for transmitting negative feedback signals from the emitter of the second transistor amplifier to the base of the first transistor amplifier and a regenerative feedback circuit and an associated tone control circuit between the first transistor amplifier and the second transistor amplifier for transmitting regenerative feedback signals from the collector of the second transistor amplifier to the base of the first transistor amplifier.

13 Claims, 3 Drawing Sheets

SIGNAL CONDITIONER SYSTEM FOR MUSICAL INSTRUMENTS

This invention relates to an electronic audio signal conditioner system and, more particularly, to a preamplifier signal conditioner system for musical instruments.

BACKGROUND AND SUMMARY OF INVENTION

In general, this invention provides an improvement of quality and control of tone in an audio amplifier system. Various musical instruments, such as a guitar, may be used with electronic sound pickup devices mounted on the instrument for connection to an amplifier system. The quality of the sound generated through the amplifier system varies substantially due to variations in the quality of the instrument, the pickup device and the amplifier system.

U.S. patents, Nos. 4,523,156 and 4,539,526, the disclosures of which are incorporated herein by reference, disclose apparatus to prevent distortion due to clipping and to prevent reproduction of transient signals introduced by power or input switching. As disclosed in these patents, prior art circuits for controlling tone in an audio amplifier have used capacitors which appear as open circuits at low frequencies with a potentiometer defining circuit gain at low frequencies (bass). At approximately 1 kHz the capacitors are much lower in impedance than one potentiometer and higher in impedance than another potentiometer so that the capacitors set circuit gain to unity at this frequency. At higher frequencies (treble) the other potentiometer is much lower in impedance than both the one potentiometer and the capacitors, such that circuit gain is controlled by the other potentiometer.

In almost any audio system the volume level or the bass (tone) controls may be increased so that the output signal at a speaker becomes very distorted, usually as the result of signal clipping. It is usually difficult to provide the desired amount of control of amplifier dynamic range in both volume and tone without encountering this problem. It is possible to still allow for the desired head room and yet prevent clipping by detecting any clipping present in the audio signal at the power amplifier, and using the detected clipping signal to decrease the bass and volume levels.

In an audio reproduction system, it is far more likely that high peak signals that can produce clipping will be encountered in lower frequencies than at higher frequencies. Since the bass is very likely to contain such high level signals, it is desirable to decrease bass response before decreasing volume level. In this way, clipping due to excess energy in the bass region of the signal is prevented without effecting the overall dynamic range of the program material presented to the amplifier. If, after decreasing response at the bass frequencies the distortion still persists, then the overall volume level may be reduced to prevent such clipping or distortion. A further type of interference is encountered when switching transients are produced by power switching or input source switching. Such transients produce a disagreeable loud pip which is reproduced by the system speakers.

Typical tone control circuits employ an operation amplifier or other such amplifier having a differential input. The amplifier's output is fed back to the negative input of the amplifier through a low frequency (bass) feedback network controlled by a high resistance potentiometer and through a high frequency (treble) feedback network controlled by a second, lower resistance potentiometer. Two capacitors filter low frequency signals from the signal flowing through the second potentiometer and define the gain of the tone control circuit as unity for midrange frequencies.

U.S. Pat. No. 4,523,156 relates to initially reducing bass response and then overall signal level in an audio amplifier to prevent clipping and to attenuate power and switching transients. An electronic variable resistor is incorporated into a tone control circuit. Initial bass response control and, thereafter, volume level control are provided when clipping or transient interference is detected. An electronically variable resistor is coupled between the output of the amplifier and the amplifier's input. By varying the resistance in response to that sensed dynamic levels and transients, the circuit bass response is initially reduced. Thereafter, overall volume level is reduced to further prevent clipping and other such distortion, should bass response reduction fail to provide adequate compensation.

U.S. Pat. No. 4,539,526 discloses an adaptive signal weighting system for use in transmitting an electrical information signal of a predetermined bandwidth along a signal path. The system can be used to encode or decode the signal. The system comprises filter means disposed in the signal path for varying the gain impressed on the portion of the information signal within a first select spectral region within the preselected bandwidth. The gain is varied in response to and as a function of a first control signal. Means are provided for generating the first control signal in response to and in accordance with the signal energy of the information signal substantially within at least a part of the first select spectral region. The system also comprises gain control means disposed in the signal path and coupled to the filter means for varying the signal gain impressed on the information signal substantially throughout the predetermined bandwidth. The signal gain is variable in response to and as a function of a second control signal. A second control signal is generated in response to and as a function of the signal energy of the information signal within at least one other select spectral region of the information signal.

The present invention provides an audio signal conditioning system comprising power supply means for supplying DC voltage to the system; audio input signal receiving means for receiving audio input signals from an audio signal source; a first high gain transistor amplifier means having a transistor base collector and emitter for receiving the audio input signals at the base thereof and providing a first amplified output signal from the collector thereof; a second transistor amplifier means having a base, collector and emitter connected to said first transistor amplifier means for receiving said first amplified output signal and providing a second amplified output signal from the collector thereof; a first transistor connector circuit means for directly connecting the collector of the said first transistor amplifier means to the base of said second transistor amplifier means; a second transistor connector filter circuit means for connecting the collector of said first transistor amplifier means to the collector of said second transistor amplifier means for transmission of high frequencies of said first amplified output signal; a first high pass filter input circuit means with first variable resistor means for selectively transmitting the audio input signals to said first amplifier means; a second normal frequency amplification input circuit means with a second variable resistor means for selectively transmitting the audio input signals to said first amplifier means; a switch means for selectively connecting the audio input signals to the base of one of said first and second amplifier means through one of said first and second input circuit means; a regenerative feedback circuit means (C10, C11, R12, C8) for connecting the collector of said second transistor means to the base of said first transistor means; an adjustable tone control circuit means in said regenerative feedback circuit means for selectively adjusting resistance therein; negative feedback circuit means for connecting the emitter of said second transistor means to the base of said first transistor means and filtering the bass response; an emitter bypass filter circuit means connected to the emitter of said second transistor means for increasing audio gain therein; an output circuit means connected to the collector of said second transistor means for outputting said second amplified audio signals therefrom; and output gain control means in said output circuit means for providing selectively variable resistance therein.

BRIEF DESCRIPTION OF DRAWINGS

An illustration and presently preferred embodiment of the invention is shown in the accompanying drawings wherein.

DETAILED DESCRIPTION

Figure 1:
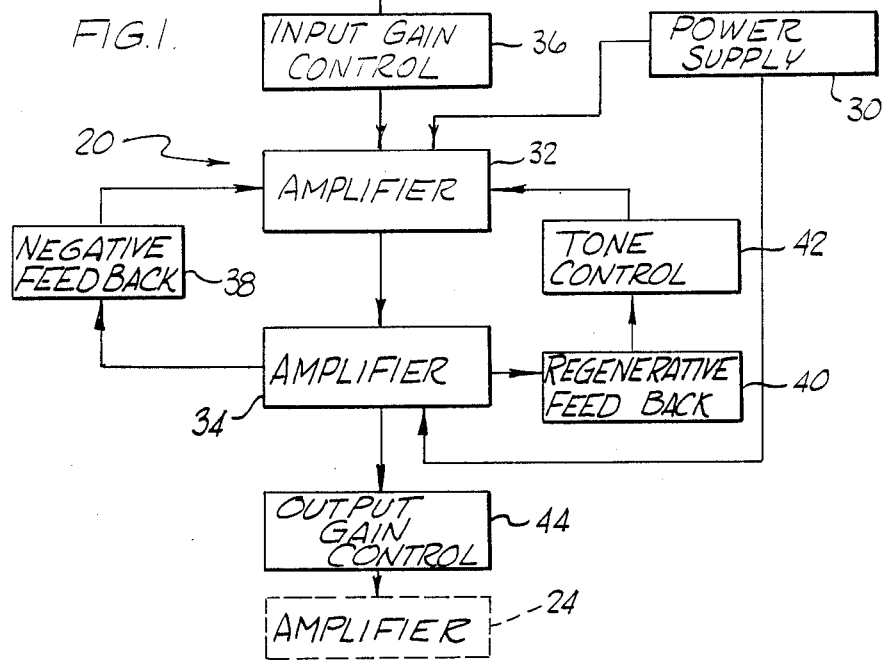
FIG. 1 is a block diagram of a system employing the invention.

In general, as shown in FIG. 1, the presently preferred embodiment of the present invention comprises a signal conditioner pre-amplifier system 20 located between the connected to a musical instrument, such as a guitar 22, by a conventional electronic pickup device and a conventional amplifier system 24.

The signal conditioner and pre-amplifier system comprises a power supply means 30, first and second amplifier means 32, 34. An input gain control circuit means 36 is connected to the first amplifier means 32. A negative feedback circuit means 38 connects the second amplifier means 34 to the first amplifier means 32. A regenerative feedback circuit means 40 connects the second amplifier means 34 to the first amplifier means 32 through a tone-control circuit means 42. The second amplifier means 34 is outputed through an output gain control circuit means 44.

Figure 2:
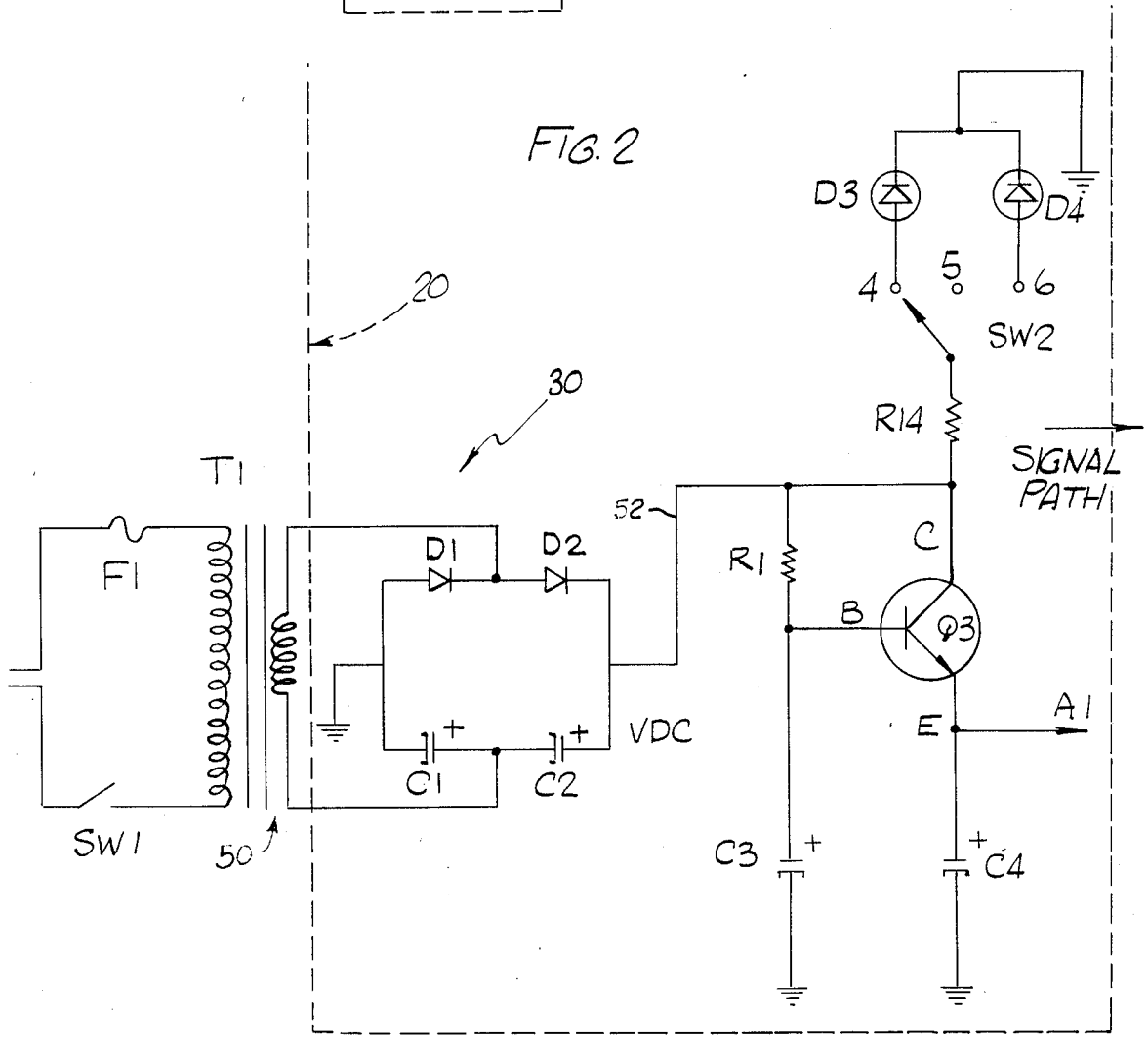
FIG. 2 is a power supply circuit diagram.
Figure 3:
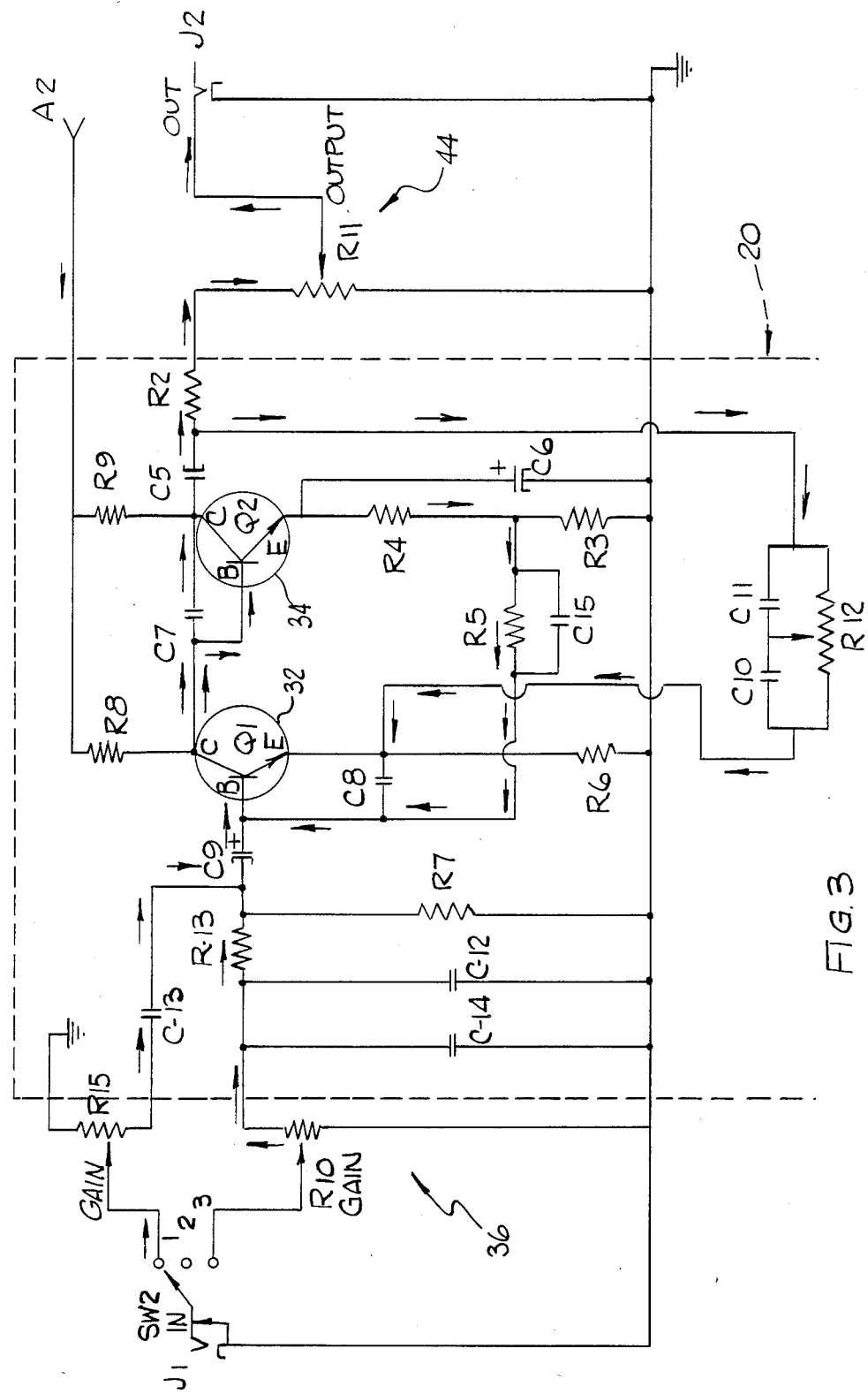
FIG. 3 is a tone control amplifier circuit diagram.
Figure 3:
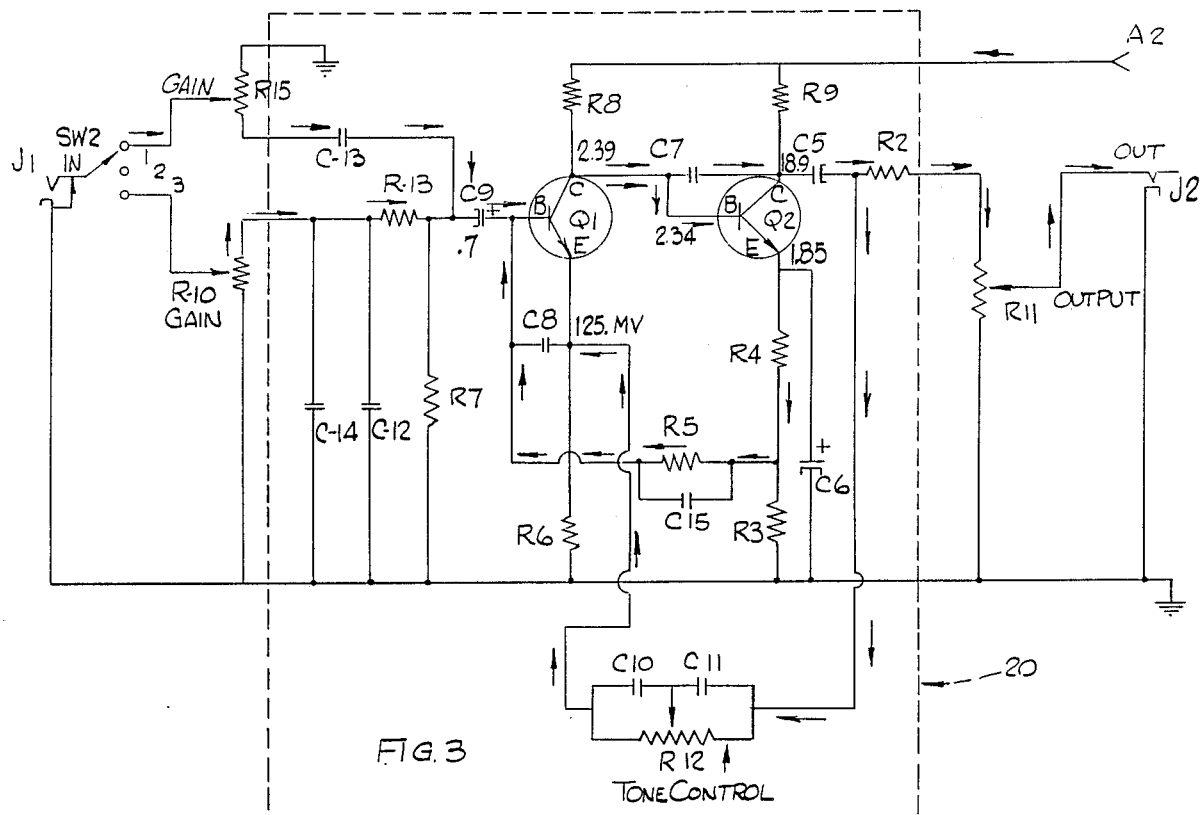
Figure 4:
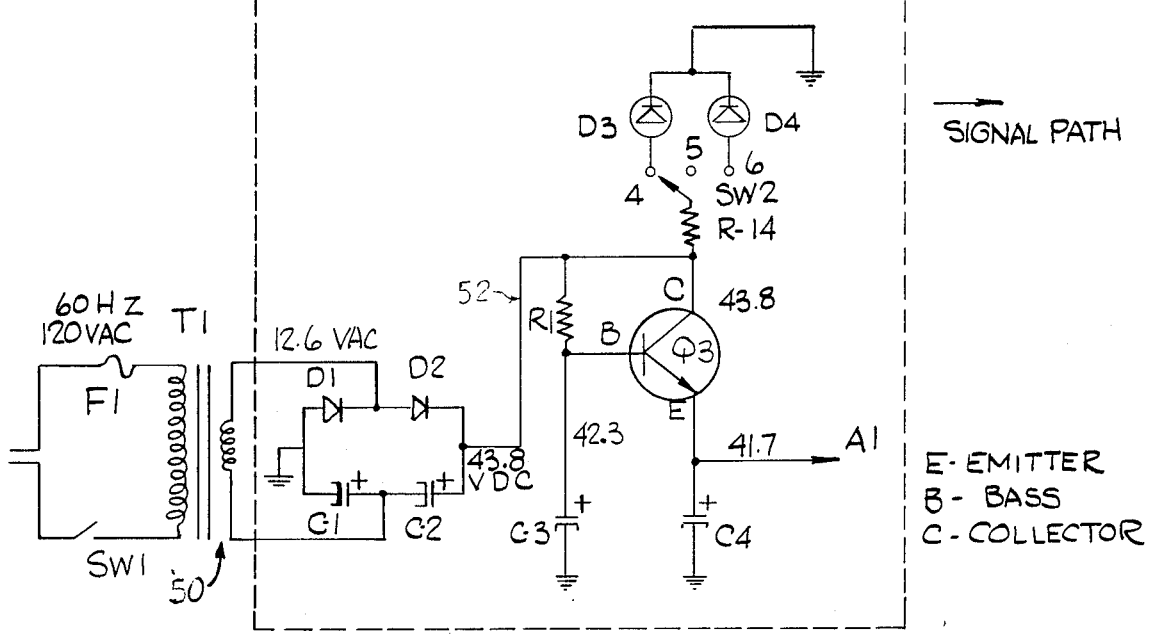
FIG. 4 is a combined circuit diagram of FIGS. 2 and 3 showing voltage values.

As shown in FIG. 2, the power supply circuit means 30 comprises a mini-stepdown transformer circuit 50 for reducing 120 volt AC input to 12.6 volt AC 300 mA and outputting 43.8 volt DC on line 52 with diodes D1, D2 and capacitors C1, C2 acting as a full wave voltage quadrupler circuit. Voltage from D2 and C2 is applied to the collector of transistor Q3 through resistor R1. This transistor acts for resistance and filtering purposes to provide 41.7 volt DC at the emitter of Q3. Capacitors C3 and C4 are for filtering purposes on Q3. Light emitting diode (LED) D3 is used to indicate that high frequency circuit R15, FIG. 3, is in use and D4 is to show normal frequency circuit R10 in use upon actuation of switch SW2 DPDT which is shown in the high frequency mode. The resistance of resistor R14 from collector Q3 is calculated based on elimination preference with respect to applied voltage and current.

The regenerative feedback circuit means 40 is shown in FIG. 3 wherein 41.7 volt D.C. is supplied through A2. The audio sources input signal at jack J1 is applied to SW2 which is shown in high frequency mode. Switch SW2 is manually operable to switch from the high frequency mode through R15 to the normal frequency mode through R10. The input signal is then routed to manually adjustable gain control resistor R15 or R10 for input signal level adjustments. The combination of resistor R15 and capacitor C13 acts as a high pass filter circuit. Resistors R10 and R13 provide a normal frequency amplification circuit, using resistor R7 as a load resistor. Capacitor C12 and resistors R13 and R7 provide a low pass filter and a voltage divider circuit for the normal mode. Capacitor C9 couples the conditioned signal to the bass of transistor Q1 which acts as a high gain common emitter amplifier which provide an amplified signal sent directly to the bass of transistor Q2. High frequencies are directly coupled to the collector of transistor Q2 through capacitor C7. The signal is amplified by transistor Q2 and passed through capacitor C5 and coupled back to transistor Q1 by a regenerative feedback circuit comprised of C10, C11, R12 and C8. Capacitors C10, C11 and resistor R12 are used for tone control in the regenerative feedback circuit. Resistor R5 and capacitor C15 filter the bass response via negative feedback to the base of Q1. Emitter circuit resistors R4, R3 and capacitor C6 prevent thermal runaway and are biasing resistors. C6 acts as an emitter bypass filter allowing maximum audio gain for Q2. Resistors R8 and R9 develop output signals for transistors Q1 and Q2, respectively. The amplified signal from Q2 passes through coupling capacitor C5, limiting resistor R2 and output gain control resistor R11 to output J2.

The circuit elements and values are as stated in Table I:

| ELEMENTS | VALUES |
| --- | --- |
| R1 | 22 K |
| R2 | 150 K |
| R3 | 470 ohm |
| R4 | 330 ohm |
| R5 | 220 K |
| R6 | 330 ohm |
| R7 | 47 K |
| R8 | 220 K |
| R9 | 10 K |
| R10 (GAIN) | 100 K |
| R11 (OUTPUT) | 100 K |
| R12 (TONE) | 100 K |
| R13 | 1 K |
| R14 | 10 K (¼ watt) |
| R15 (GAIN) | 100 K |
| C1 | 100 uf |
| C2 | 100 uf |
| C3 | 100 uf |
| C4 | 100 uf |
| C5 | 4.7 uf |
| C6 | 50 uf |
| C7 | 150 uf |
| C8 | .001 uf |
| C9 | 4.7 uf |
| C10 | .01 uf |
| C11 | 150 pf metal film |
| C12 | 220 pf |
| C13 | .01 uf metal film |
| C14 | .01 uf |
| C15 | .001 uf |
| J1 2-CONDUCTOR ¼" CLOSED CIRCUIT JACK | |

| ELEMENTS | VALUES |
| --- | --- |
| Q1 AUDIO/RF AMP | 123 ap ECG |
| Q2 AUDIO/RF AMP | 123 ap ECG |
| Q3 AUDIO/RF AMP | 123 ap ECG |
| D1 | 2 amp |
| D2 | 2 amp |
| D3 | LED. |
| D4 | LED. |
| SW1 (ON & OFF) | 125 V 3 A |
| SW2 (DPDT) | BRIGHT/NORMAL |
| SW3 (DPDT) | LED. D3 LED.D4 |
| TRANSFORMER 120 VAC Pri. | 12.6 V 300 mA SEC. |
| FUSE | lamp |
| J2 2-CONDUCTOR (MONAURAL) ¼" OPEN JACK | |

J1 is a closed circuit jack which when not in use is shorted to ground. Switch SW2 is shown in the high frequency mode. Switch SW2 is for two purposes: (1) for applying signal and (2) for applying voltage to light emitting diodes. This switch is a D.P.D.T. switch to enable the operator to see which variable resistor is in use, R15 or R10, high end or low end.

R15 is a variable gain control. In one position at the extreme left, it is grounded so that the signal cannot pass through. In another position of the control, at extreme right, a full signal can be applied. R10 works and serves the same purpose on the normal side. These controls are needed so as not to overdrive Q1, as some guitar pickups put out more signal voltage than others.

The fixed tone control input is made up as two parts: high end and low end. C13 passes high frequency. The high pass filter is used to make up for the different tone quality that may come out of different types of guitar pickups or instruments.

C12 diverts unwanted frequencies to ground thus creating a low end frequency sound. R13 and R7 are used as a voltage divider. R7 also acts as a load resistor to consume some of the input signal voltage. R13, R7 and C12 provides a low pass filter to compensate for poor quality pickups that produce unwanted highs. C14 is used in parallel with C12 for all acoustical instruments. C14 is used to provide the natural sound of the acoustical instrument while being amplified.

C9 couples the conditioned signal to the base of Q1. Q1 acts as a high gain common emitter amplifier transistor. The amplified signal from Q1 is sent directly to the base of Q2, then is amplified. C7 acts as a blocking capacitor and allows for passage of high frequencies. C7 is directly coupled from collector of Q1 to the collector of Q2. Q2 then amplifies the signal and passes through C5 and R2. C5 is used for coupling into R2 and R11. R2 attenuates a very small amount of signal and works with the R11 volume control. When control is at extreme left, it is shorted to ground. When it is at the extreme right, it is at full volume.

A variable tone control is used in feedback circuit. When the variable tone control is at the extreme left, C10 is shorted permitting relatively lower reactance of C11 to pass signals at normal attenuation. When at the extreme right, C11 is shorted leaving C10 in series with the signal input to provide lower capacitance which causes an increasing greater attenuation for signals of lower frequencies. Attenuation of lower frequency signals causes the higher frequency signals, by compression, to predominate. Variable settings of R12 provide various degrees of control for this circuit therefore working as a tone control. FIG. 2 shows a common tone control in the input section that is not used in this circuit.

The degenerative feedback circuit has been designed to bias Q1 by using R5. R5 and C15 filter the bass response by way of negative feedback to base of Q1. Also, C15 gives extra clarity to a guitar pickup. The value of C15 is calculated to provide maximum results. R5 and C15 are generally known as a bandpass filter.

In the power supply circuit, F1 is used in the primary circuit for safety. SW1 is used for On and Off on the primary side of T1 which is a mini step down transformer. T1 has 120 VAC for primary and 12.6 VAC 300 mA for SEC., using D1, D2 and C1, C2, as a full wave voltage quadrupler, resulting in 43.8 VDC at D2 and C2. Voltage from D2 and C2 is applied to the collector of Q3 and R1. The Q3 transistor acts for resistance and filtering purposes. R1 provides biasing for Q3, resulting in 41.7 VDC at the emitter of Q3. C3 and C4 are for filtering purposes on Q3. Light emitting diode (LED) D3 is used to indicate that R15 is in use and D4 is used to show R10 is in use by SW2 DPDT switch which is to indicate it is in the high frequency mode. The value of R14 is calculated with respect to applied voltage and current on Q2.

Indicated voltages have been measured with a digital meter. The power supply values have been measured with load and amplifier values have been measured without signal applied. All the capacitors are ceramic except as indicated.

The presently preferred values of the elements of Table I may be modified as follows with some loss of quality:

| | |
| --- | --- |
| R10 and R15 | (10 or 50 K); |
| C13 and C14 | (.01 to 0.1 mf); |
| C12 | (100 to 500 mf); |
| C11 | (80 to 220 mf); |
| C10 | (.001 to 0.1 mf); |
| R12 | (100 to 150 K); |
| C8 | (.001 to 150 mf); and |
| C7 | (80 to 150 mf). |

Tests indicate that variances in the value of C7 and C15 have the most adverse effects.

The transistor voltages in the presently preferred embodiment are as follows: Q1 base (0.7 v); Q1 emitter (125 mv); Q2 base (2.34 v); Q2 emitter (1.85 v) and Q2 collector (18.9 v).

The present invention provides fixed tone control in an input section with dual input; variable tone control in a regenerative feedback circuit; filtering of the bass response by way of negative feedback; and fixed tone, positive feedback tone, negative feedback depth tone all working at the base of Q1 for a bigger (higher level) sound.

The present invention has been used with various types of conventional guitars and conventional amplifier systems with excellent results. The improvement in quality of sound in each instance has been exceptional regardless of the type and quality of the guitars or the amplifier system employed. The quality of the audio output signals on guitars vary substantially depending on the quality of the guitar and the guitar pickup device. Some of the factors relate to the number of windings; gauge of wire; and type of magnetic material of the pickup; location of the pickup relative to the guitar bridge and the neck; and the type of wood and construction of the guitar (e.g., hollow or solid body). The present invention has also been tested with some other types of audio signal sources with notable improvement in sound quality in some instances.

C6 acts as an emitter bypass filter allowing maximum audio gain for Q2 and also adds depth of tone to this circuit. R6, R4 and R3 all prevent thermal transistor runaway and act as biasing resistors. R8 and R9 develop and control the output signal for Q1 and Q2, respectively.

While the foregoing preferred embodiment of the invention has been developed specifically for a guitar-type musical instrument, tests have shown improved results in conjunction with various other types of other audio signal means, such as radio and tape player devices. Thus, is it intended that the appended claims be construed to include various illustrative embodiments, except insofar as limited by the prior art.

What is claimed is:

1. A signal conditioning pre-amplifier means for connecting audio sound output signals from a musical instrument, such as a guitar, to an audio sound amplifier device comprising:
   power supply means for providing a direct current having a predetermined voltage;
   input gain control means for receiving the audio sound output signals and for controlling gain;
   first transistor amplifier means connected to said input gain control means for receiving the audio sound output signals from said input gain control means said first transistor means having a transistor base and collector and emitter for receiving the audio sound output signals at the base thereof and providing a first amplified output signal from the collector thereof;
   a second transistor amplifier means connected to said first transistor amplifier means for receiving said first amplified output signal from said first transistor amplifier means said second transistor means having a base and collector and emitter connected to said first transistor amplifier means for receiving said first amplified output signal at the base thereof and providing a second amplified output signal from the collector thereof;
   negative feedback circuit means between said first transistor amplifier means and said second transistor amplifier means for transmitting negative feedback signals from the emitter of said second transistor amplifier means to the base of said first transistor amplifier means;
   regenerative feedback circuit means and an associated tone control circuit means between said first transistor amplifier means and said second transistor amplifier means for transmitting regenerative feedback signals from the collector of said second transistor amplifier means to the base of said first transistor amplifier means; and
   output gain control means for receiving said second amplified output signal from the collector of said second transistor amplifier means.

2. An audio signal conditioning system comprising:
   power supply means for supplying DC voltage to the system;
   audio input signal receiving means for receiving audio input signals from an audio signal source;
   a first high gain transistor amplifier means having a transistor base and collector and emitter for receiving the audio input signals at the base thereof and providing a first amplified output signal from the collector thereof;
   a second transistor amplifier means having a base and collector and emitter connected to said first transistor amplifier means for receiving said first amplified output signal and providing a second amplified output signal from the collector thereof;
   a first transistor connector circuit means for directly connecting the collector of the said first transistor amplifier means to the base of said second transistor amplifier means;
   a second transistor connector filter circuit means for connecting the collector of said first transistor amplifier means to the collector of said second transistor amplifier means for transmission of high frequencies of said first amplified output signal;
   a first high pass filter input circuit means with first variable resistor means for selectively transmitting the high frequency audio input signals to said first amplifier means;
   a second low pass filter input circuit means with a second variable resistor means for selectively transmitting the low frequency audio input signals to said first amplifier means;
   a switch means for selectively connecting the audio input signals to the base of said first amplifier means through one of said first high pass filter input circuit means and said second low pass filter input circuit means; and
   a regenerative feedback circuit means for connecting the collector of said second transistor means to the base of said first transistor means.

3. The invention as defined in claim 2 and further comprising:
   an adjustable tone control circuit means in said regenerative feedback circuit means for selectively adjusting resistance therein.

4. The invention as defined in claim 2 and further comprising:
   negative feedback circuit means for connecting the emitter of said second transistor means to the base of said first transistor means and filtering the bass response.

5. The invention as defined in claim 4 and further comprising:
   an emitter bypass filter circuit means connected to the emitter of said second transistor means for increasing audio gain therein.

6. The invention as defined in claim 5 and further comprising:
   an output circuit means connected to the collector of said second transistor means for outputting said second amplified audio signals therefrom; and
   output gain control means in said output circuit means for providing selectively variable resistance therein.

7. The invention as defined in claim 6 and wherein:
   said audio input signals are derived from an electronic pickup device associated with a guitar.

8. The invention as defined in claim 7 and wherein:
   said second amplified audio signals are outputted to an amplifier system.

9. The invention as defined in claim 2 and further comprising:
   an emitter bypass filter circuit means connected to the emitter of said second transistor means for increasing audio gain therein.

10. The invention as defined in claim 9 and further comprising:
  an output circuit means connected to the collector of said second transistor means for outputting said second amplified audio signals therefrom; and
  output gain control means in said output circuit means for providing selectively variable resistance therein.

11. The invention as defined in claim 2 and further comprising:
  an adjustable tone control circuit means in said regenerative feedback circuit means for selectively adjusting resistance therein.

12. The invention as defined in claim 11 and further comprising:
  an emitter bypass filter circuit means connected to the emitter of said second transistor means for increasing audio gain therein.

13. The invention as defined in claim 12 and further comprising:
  an output circuit means connected to the collector of said second transistor means for outputting said second amplified audio signals therefrom; and
  output gain control means in said output circuit means for providing selectively variable resistance therein.

* * * * *